(12) United States Patent
Imoto (10) Patent No.: US 6,335,561 B2
(45) Date of Patent: *__Jan. 1, 2002__

(54) SEMICONDUCTOR DEVICE HAVING A PASSIVATION FILM

(75) Inventor: Shinya Imoto, Kyoto (JP)

(73) Assignee: Rohm Co., Ltd., Kyoto (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/233,422

(22) Filed: Jan. 20, 1999

(30) Foreign Application Priority Data

Jan. 20, 1998 (JP) .......................................... 10-008715

(51) Int. Cl.[7] .............................................. H01L 29/06
(52) U.S. Cl. ...................... 257/626; 257/638; 257/641; 257/650
(58) Field of Search ................................. 257/797, 638, 257/641, 643, 644, 650; 438/691, 692

(56) References Cited

U.S. PATENT DOCUMENTS

| | | | | |
|---|---|---|---|---|
| 5,510,653 A | * | 4/1996 | Fujiki et al. | 257/759 |
| 5,576,573 A | * | 11/1996 | Su et al. | 257/391 |
| 5,798,545 A | * | 8/1998 | Iwasa et al. | 257/301 |
| 5,929,528 A | * | 7/1999 | Kinugawa | 257/776 |

FOREIGN PATENT DOCUMENTS

| | | |
|---|---|---|
| JP | 62-18062 A | 1/1987 |
| JP | 7-066201 A | 3/1995 |
| JP | 7-115175 A | 5/1995 |

* cited by examiner

*Primary Examiner*—Minh Loan Tran
(74) *Attorney, Agent, or Firm*—Morgan, Lewis & Bockius LLP (57) ABSTRACT

A semiconductor device comprises a semiconductor substrate having an area in which a circuit element is formed, and a passivation film formed on an upper surface of the semiconductor substrate, at least part of the passivation film being uneven shaped film, an upper surface of which is formed into an uneven shape independent of a shape of a lower surface of the passivation film layer.

22 Claims, 11 Drawing Sheets

SEMICONDUCTOR DEVICE HAVING A PASSIVATION FILM

BACKGROUND OF THE INVENTION

1. Field of the Invention

The present invention relates to a semiconductor device. More particularly, the present invention relates to a semiconductor device having a passivation film formed on a semiconductor substrate layer in which circuit elements are provided.

2. Description of the Related Art

Figure 11:
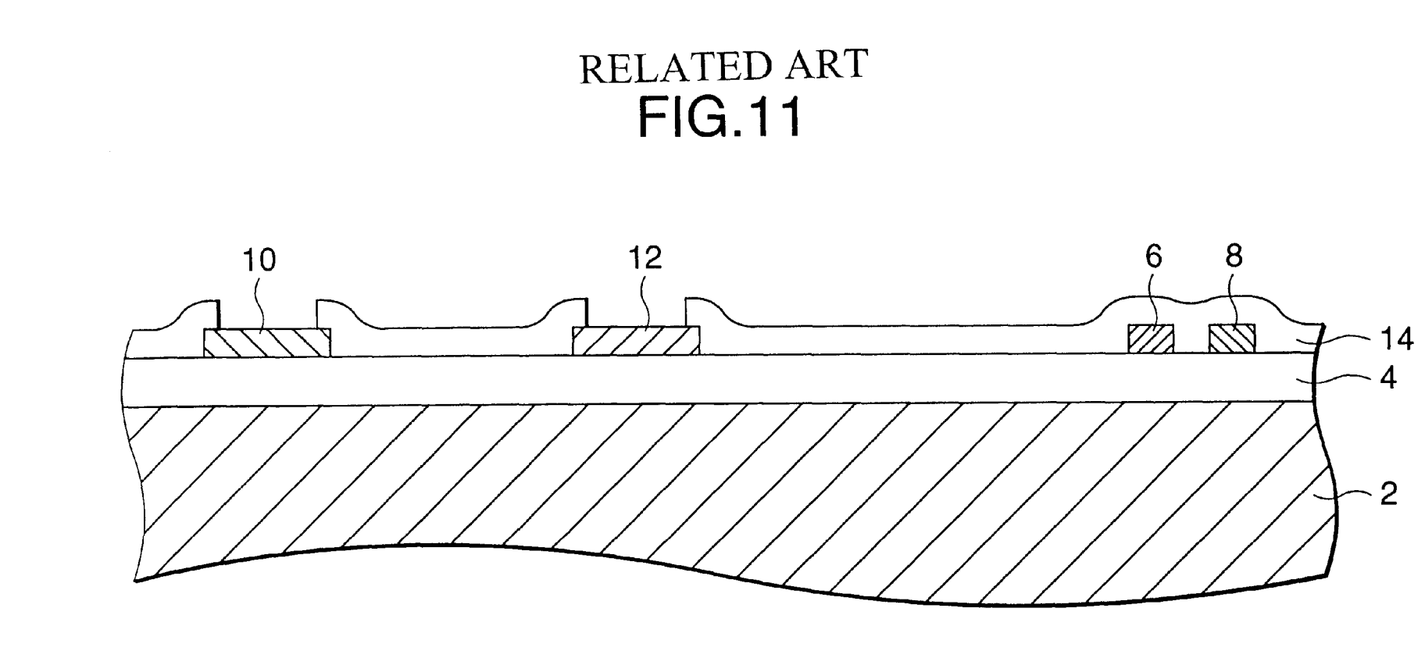
FIG. 11 is a partial section view showing a structure of related IC chip.

IC chips are well known in which a large number of circuit elements such as transistors, aluminum wirings and pads are provided on one semiconductor substrate. FIG. 11 is a cross-sectional view showing a portion of a related IC chip. An insulating film 4 is formed on an element formation layer 2 on which transistors (not shown) and other elements are provided. On a surface of IC chip, a a passivation film 14 is formed.

By forming the passivation film 14, it is possible to physically protect the transistors and aluminum wirings 6, 8, and it is also possible to prevent water from infiltrating IC chips.

However, the above conventional IC chip has the following disadvantages. When transistors arranged in IC chip is operated, the transistors generate heat. A portion of the thus generated heat is emitted outside through the passivation film 14. However, an upper surface of the passivation film 14 is almost flat except for portions in the peripheries of the aluminum wirings 6, 8 and pads 10, 12.

Therefore, the heat radiation efficiency is not sufficient because heat is emitted through the passivation film 14. Accordingly, an increased temperature of the chip causes limitations for further enhancement of the transistor performance. The above problem is very serious especially in IC chips, which generate a large amount of heat, such as IC chips having power transistors or CPU. Also, the above problem is very serious especially in IC chips, having a passivation film formed on a base layer of the insulating film 4, planarized by the method of CMP (chemical and mechanical polishing) for the purpose of high integration.

SUMMARY OF THE INVENTION

It is therefore an object of the present invention to solve the above problems and provide a semiconductor device having a passivation film (protective film), the heat radiation efficiency of which is improved.

In the first aspect of the semiconductor device of the present invention, at least part of the passivation film being uneven shaped film, an upper surface of which is formed into an uneven shape independent of a shape of a lower surface of the passivation film layer.

Accordingly, even in the case that a base layer on which the passivation film is formed is flat, it is possible to form an upper surface of the passivation film into an uneven surface. For the above reasons, it is possible to increase a surface area of the passivation film per unit projected area. Consequently, a heat radiating area of the passivation film can be increased. As a result, a larger amount of heat can be emitted outside through the passivation film. In other words, it is possible to enhance the heat radiation efficiency through the passivation film. As a result, it is possible to enhance the performance of the semiconductor device.

In the second aspect of the semiconductor device, the passivation film is formed so as to include thick portions having large thickness of the film and thin portions having small thickness of the film, in an area in which the circuit element is formed.

In the third aspect of the semiconductor device, the passivation film is formed on a planarized insulating layer as a base layer.

In the fourth aspect of the semiconductor device, the base layer is planarized by the CMP method.

In the fifth aspect of the semiconductor device, the base layer includes an insulating layer planarized by the CMP method and a wiring section formed on a part of the insulating layer.

Recently, planarization of the surface of the semiconductor device is regarded as important in view of micronization and high-integration of the semiconductor device.

According to the above configuration, even in the semiconductor device in which the base layer is planarized, the heat radiation area can be increased and thereby the efficiency of the heat radiation through the passivation film can be enhanced. Further, as the film thickness is varied in accordance with a state of circuit elements formed in the base layer, so as to have large thickness at that portions such thickness is required and so as to have small thickness at any portions other than the portions at which the large thickness is required, the heat radiation efficiency can be enhanced while keeping reliability thereof.

In the sixth aspect of the semiconductor device, wherein at least one of the thin portions and the thick portions are arranged so as to be a closest packing structure.

In the seventh aspect of the semiconductor device, the thin or thick portions are regularly arranged such that the each center of adjacent thin or thick portions form a regular triangle.

Accordingly, the surface area of the uneven passivation film can be made maximum within a range of restriction of processing technique. Accordingly, it is possible to further enhance the heat radiation efficiency through the passivation film.

In the eighth aspect of the semiconductor device, the thin portion is formed so as to be the minimum thickness capable of protecting the circuit element.

Accordingly, even if the surface area is the same, it is possible to obtain the passivation film, the average film thickness of which is thinner. Therefore, it is possible to further enhance the heat radiation efficiency through the passivation film.

In the ninth aspect of the semiconductor device, the uneven shaped area may be formed into a shape such that a plurality of independent thick portions are provided on the passivation film which is substantially planar.

Accordingly, as compared with a case that a plurality of independent thin portions are provided on an upper surface of a flat passivation film, even if the surface area, the film thickness of the thin portion and the film thickness of the thick portion are respectively the same, it is possible to obtain an uneven passivation film, the average film thickness of which is thinner. Therefore, it is possible to further enhance the heat radiation efficiency through the the passivation film.

In the tenth aspect of the semiconductor device, at least one of corner portions of the each thin portion and each thick portion defined by the each thin portion may be rounded.

When the corner portions of the each thin portion is rounded, stress concentration caused in the corners of the thin portion can be reduced. Therefore, even if the passivation film is deformed, it is possible to reduce a possibility that the thin portion of the uneven passivation film is broken.

When the corners of the each thick portion are tapered, even if an upper surface of the semiconductor device is covered with a sealing material, stress concentration caused in the sealing material at a position opposed to the corner of the thick portion can be reduced. Therefore, even if the sealing material is deformed, it is possible to reduce a possibility that the sealing material is broken. As a result, it is possible to reduce a possibility that the semiconductor device itself is broken.

That is, while a function of protecting the circuit elements are protected physically, the heat radiation efficiency through the passivation film can be enhanced.

In the eleventh aspect of the semiconductor device, the uneven shaped film is formed in a vicinity of the circuit element generates a large amount of heat generation, the vicinity includes at least a part of above the circuit element.

Therefore, it is possible to emit heat generated by the circuit elements more effectively. Accordingly, while a portion in which the uneven passivation film is formed is minimized, the heat radiation efficiency through the passivation film can be enhanced, which is effective when it is necessary to reduce a portion in which the uneven surface film is formed.

In the twelfth aspect of the semiconductor device, a base layer on which the passivation film is to be formed includes insulating film covers the circuit element, and a plurality of conductive sections formed on a part of the insulating film, and the uneven shaped film is arranged between the conductive sections.

Accordingly, in a portion which is located between the conductive sections, in which no circuit elements such as other conductive sections exist immediately below the passivation film, no problems are caused even if the thickness of the passivation film is reduced. Due to the foregoing, it is possible to form an uneven passivation film, the thin portion of which is thin. That is, it becomes possible to form an uneven passivation film, the average film thickness of which is small and the heat radiation efficiency of which is high.

In the thirteenth aspect of the semiconductor device, an electric potential difference may exist between the conductive sections.

Therefore, it is possible to increase an electric resistance of the passivation film which corresponds to a path of leak current flowing between the conductive sections having an electric potential difference. Therefore, the insulating property between the conductive sections can be enhanced. In the case where a passivation film having a very low electric conductivity is used for the purpose of releasing an electric charge accumulated on and in the passivation film, there is a tendency that the insulating property between the conductive sections is lowered. In this case, it is possible to enhance the insulating property between the conductive sections by providing an uneven passivation film between the conductive sections, which is very preferable.

In the fourteenth aspect of the semiconductor device, the conductive sections may include conductive sections exposed from the passivation film, and the uneven shaped film is arranged between the exposed conductive sections having the electric potential difference therebetween.

Accordingly, it is possible to extend length of the conductive path on the passivation film surface on which a leak electric current flows most easily among the paths of leak currents flowing between the exposed conductive sections.

In the fifteenth aspect of the semiconductor device, the semiconductor device may further comprise a base layer on which the passivation film is to be formed includes insulating film, and at least two wiring sections formed on a part of the insulating film, and the uneven shaped film has at least one groove portion of the thin portion extending in parallel with at least one of the wiring sections.

Accordingly, the electric resistance of the passivation film, which is a path of leak current, can be enlarged and thereby insulating property between the wiring section can be enhanced.

In the sixteenth aspect of the semiconductor device, the semiconductor device may further comprise at least two electrode pads exposed from the passivation film, and the uneven shaped film has an uneven surface between the electrode pads.

Due to the electric potential difference between the electrode pads, the leak current tends to flow therebetween. According to the above configuration, since the uneven area is arranged between the pads, the current path is elongated and thereby the electric resistance therebetween can be increased. Accordingly, such the leak current can be reduced.

In the seventeenth aspect of the semiconductor device, passivation film may include at least one of silicon-rich SiN film, silicon-rich SiO film and silicon-rich SiON film.

In case such materials having a little conductivity such as silicon-rich SiN film, silicon-rich SiO film and silicon-rich SiON film are adopted as the passivation film, it is so effective to reduce the leak current.

In the eighteenth aspect of the semiconductor device, the passivation film may include a first insulating layer and a second insulating layer covered on the first insulating layer and having etching selectivity with respect to the first insulating layer, and portions where the second insulating layer is selectively removed and thereby only the first insulating layer remains constitute the thin portions.

Accordingly, degree of the etching can be controlled with high accuracy. Further, since the thin portion is constituted by the lower film and the thick portion is constituted by the two-layer film, there can be obtained a passivation film with high heat radiation efficiency and high reliability.

In the nineteenth aspect of the semiconductor device, passivation film may include first silicon oxide film, silicon nitride film laminated on the first silicon oxide film and second silicon oxide film laminated on the silicon nitride film, the thin portions are constituted by the first silicon oxide film and the silicon nitride film, and the thick portions are constituted by the first silicon oxide film, the silicon nitride film and the second silicon oxide film.

Accordingly, even in the thin portions, two-layer film can be obtained. Therefore, the passivation effect thereof can be enhanced.

In the twentieth aspect of the semiconductor device, the passivation film is formed so as to include thick portions having large thickness of the film and thin portions having small thickness of the film, on an area in which the circuit element is formed.

According to the above configuration, even if the surface of the element formation area is planar, since the passivation film includes therein the thin and thick portions, the heat radiation efficiency can be enhanced while keeping the flatness of the film surface.

Here, the passivation film is defined as a film having a surface with high reliability with respect to the initial characteristics and the variation with time by suppressing unstableness of the surface thereof. It represents the chemical surface treating, the protective film forming, processing for surface shape, or the combination thereof.

DESCRIPTION OF THE PREFERRED EMBODIMENTS

Figure 1A:
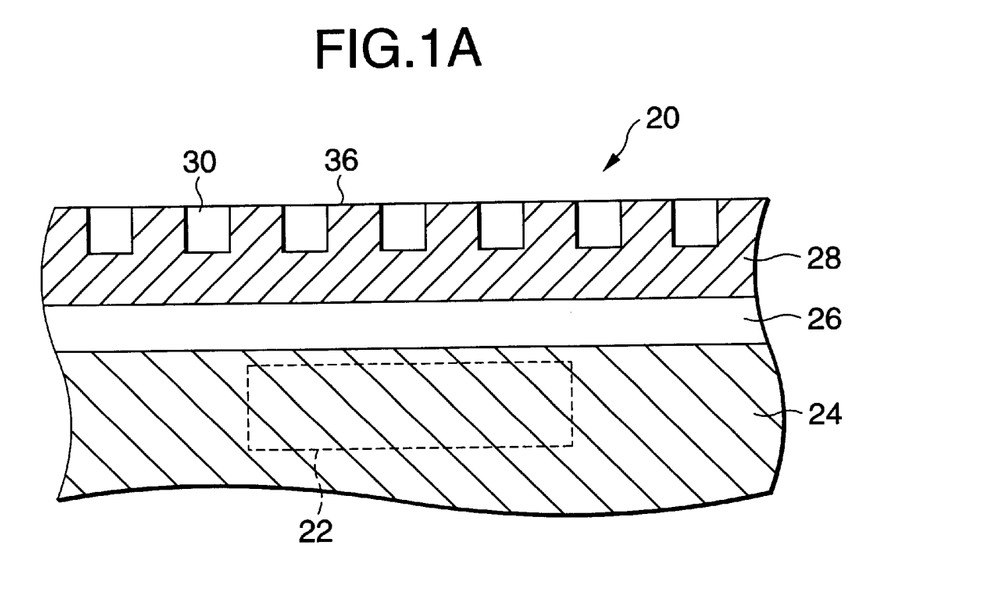
FIG. 1A is a partial section view showing a structure of IC chip which is a semiconductor device according to a first embodiment of the present invention.
Figure 1B:
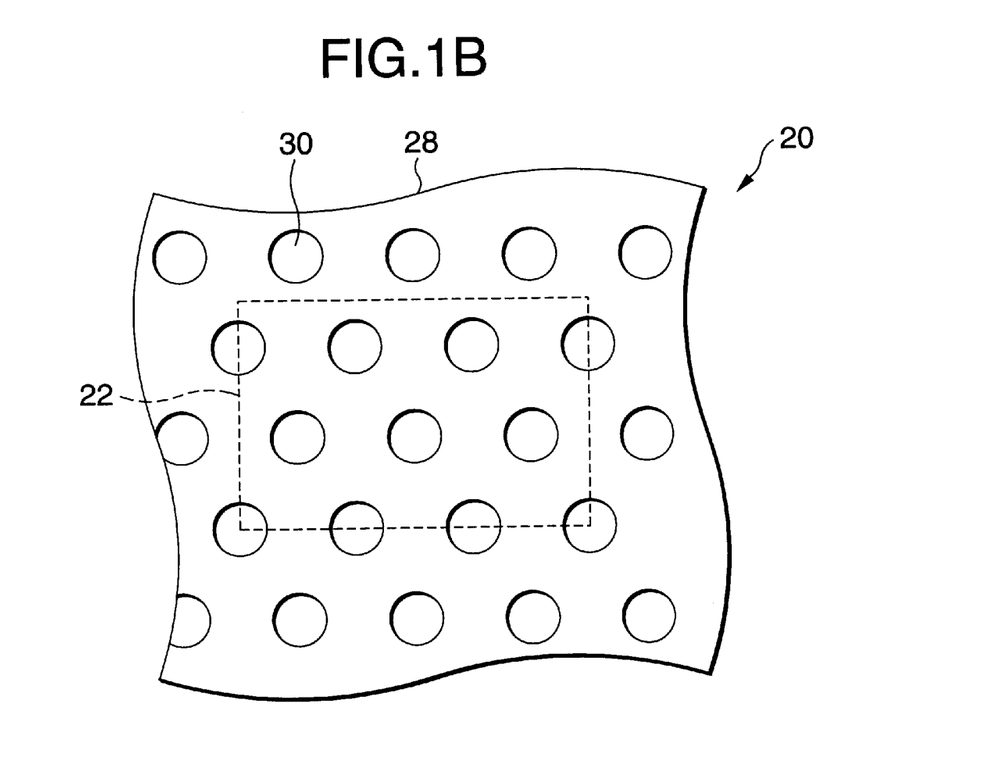
FIG. 1B is a plan view showing the IC chip of FIG. 1.

FIG. 1A shows a part of the cross-section of IC chip 20 as a semiconductor device according to a first embodiment of the present invention. FIG. 1B is a plan view of the IC chip 20. This IC chip 20 includes a circuit element 22 such as a transistor, which generates heat when it is operated.

The circuit element 22 is formed in an element formation layer 24. The semiconductor substrate may or may not be the element formation layer 24. For example, an epitaxial growth layer formed on the semiconductor substrate may be the element formation layer 24.

An insulating layer 26 is formed on the element formation layer 24, and aluminum wirings and pads (not shown) are formed on the insulating layer 26. A passivation film 28 (protective film) is formed on the surface of IC chip 20.

An upper surface of the insulating film 26, which is a base layer of the passivation film 28, is planalized. Therefore, a lower surface of the passivation film 28 is also flat. On the other hand, a large number of independent thin portions 30 are formed on an upper surface of the passivation film 28. That is, the shape of the upper surface of the passivation film 28 is uneven independent of the shape of the lower surface of the passivation film 28. In this embodiment, the entire upper surface of the passivation film 28 is formed. The thickness of the passivation film is 1.0–1.5 $\mu$m, and that of the thin portions 30 is 200–500 nm.

Therefore, even if the insulating film 26, which is a base layer on which the passivation film 28 is to be formed, is flat, it is possible to increase a surface area of the passivation film 28 per unit project area. Since the heat radiating area of the passivation film 28 is increased, heat generated by the circuit elements 22 is effectively emitted outside through the passivation film 28. In other words, it is possible to increase the heat radiation efficiency through the passivation film 28.

The shape and arrangement of the thin portion 30 provided on the upper surface of the passivation film 28 are not limited to the specific example shown in FIG. 1B. The thickness of the thin portions 30 must be formed so as to have sufficient passivation. It should be 200–500 nm, preferably, 300–400 nm. It should be one fifth to one third of the thickness of thick portions 36. Another examples of the shape and arrangement patterns of the thin portions 30 are shown in FIGS. 2A to 2F.

Figure 2A:
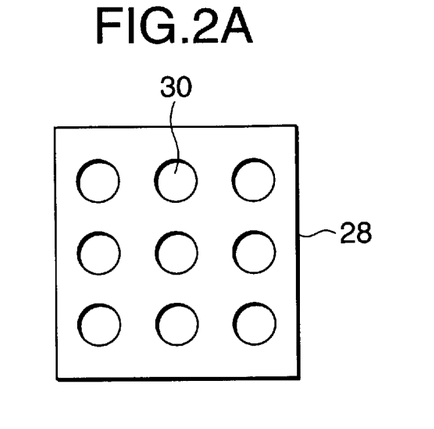
FIGS. 2A to 2F are plan views showing other examples of the shape and arrangement pattern of the thin portions of FIG. 1.

In FIG. 2A, though the shape of the thin portion 30 is circular which is same with the shape shown in FIG. 1B, the arrangement pattern is different. In FIG. 1B, each thin portion 30 is arranged alternately with respect to each row and column, however, in FIG. 2A, the thin portions are arranged in a lattice pattern.

Figure 2B:
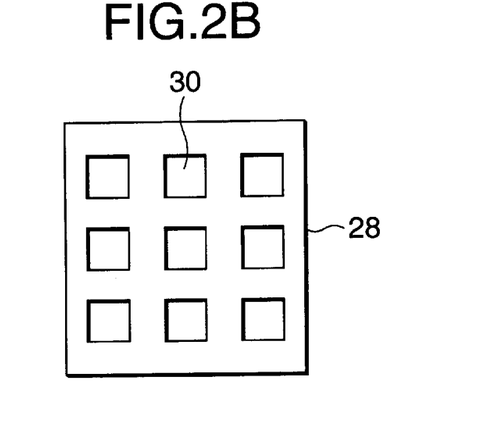
Figure 2C:
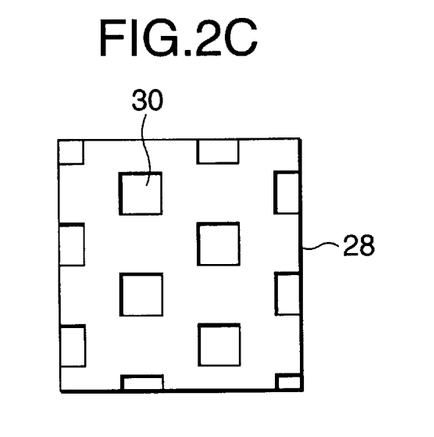
Figure 2D:
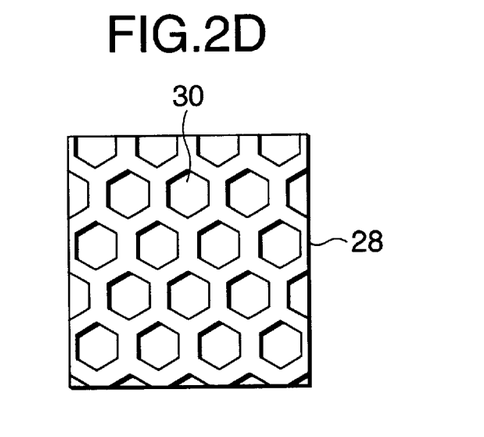
Figure 2E:
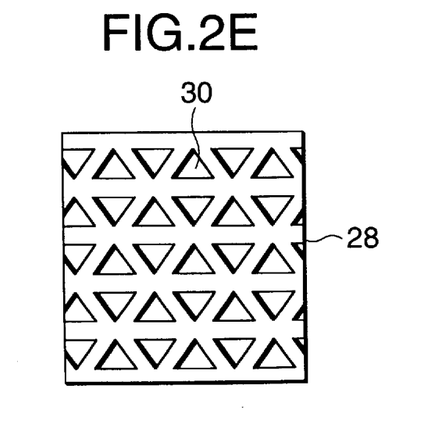
Figure 2F:
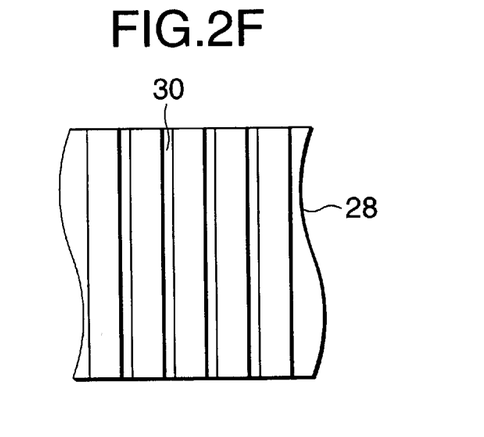

FIG. 2B is an example where square thin portions 30 are arranged in a lattice pattern. FIG. 2C is an example where square thin portions 30 are arranged alternately with respect to each row and column. FIG. 2D is an example where hexagonal thin portions 30 are arranged alternately with respect to each row. FIG. 2E is an example where triangular thin portions 30 are arranged. FIG. 2F is an example where belt-shaped thin portions 30 are arranged in parallel.

Figure 3A:
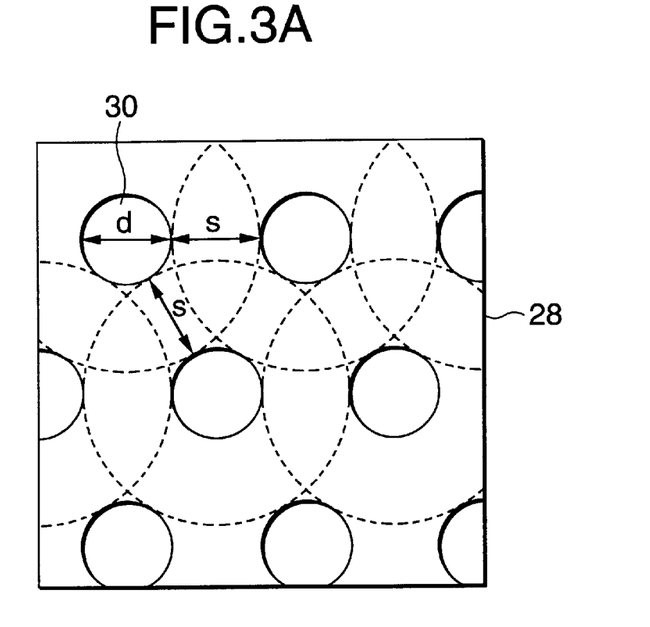
FIG. 3A is a plan view showing a state in which the circular thin portions are arranged to be a closest packing structure.

The case in which the thin portions 30 are arranged in a closest packing structure will be explained by using the circular thin portions 30 as an example,. FIG. 3A shows a case in which a large number of circular thin portions 30 are arranged to be a closest packing structure, wherein "d" is the minimum diameter of the holes determined by the condition of processing such as etching, and "s" is the minimum width of the wall remaining between the circular thin portions 30. As can be seen in FIG. 3A, when the circular thin portions 30 are most closely arranged, the thin portions 30 are arranged alternately with respect to each row and the centers of each three thin portions arranged most closely forms a regular triangle.

When the thin portions 30 are most closely arranged as described above, it is possible to maximize the surface area of the passivation film 28 within the limitation of the technique of processing such as etching. Therefore, the heat radiation efficiency through the passivation film 28 can be further enhanced.

Figure 3B:
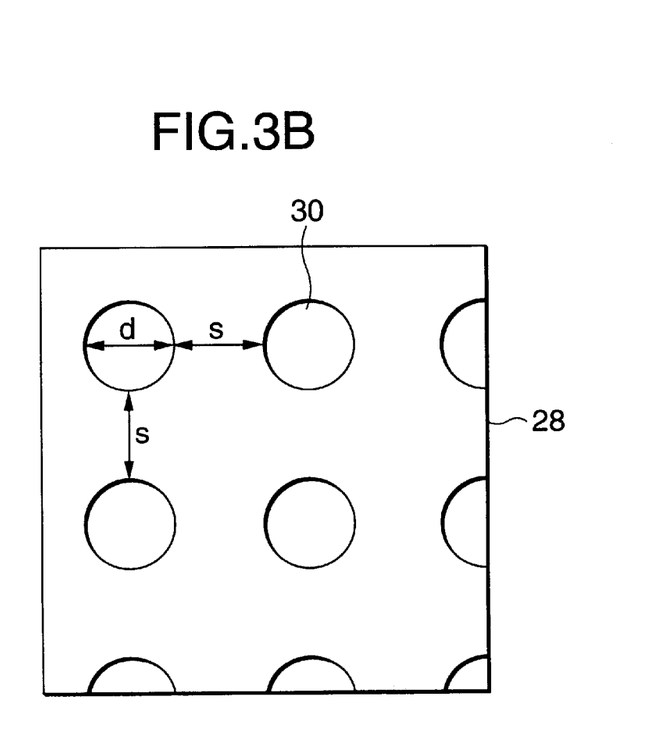
FIG. 3B is a plan view showing a state in which the circular thin portions are arranged in a grid-shape.

FIG. 3B shows a case though this is not the closest arrangement, in which the circular thin portions 30 are arranged in a lattice with the minimum hole diameter "d" and the minimum remaining wall width "s". As can be seen in FIGS. 3A and 3B, the number of the thin portions 30 is 6.25 in FIG. 3B, where the number of the thin portions 30 is not less than 7 in FIG. 3A which shows the closest arrangement.

Figure 4:
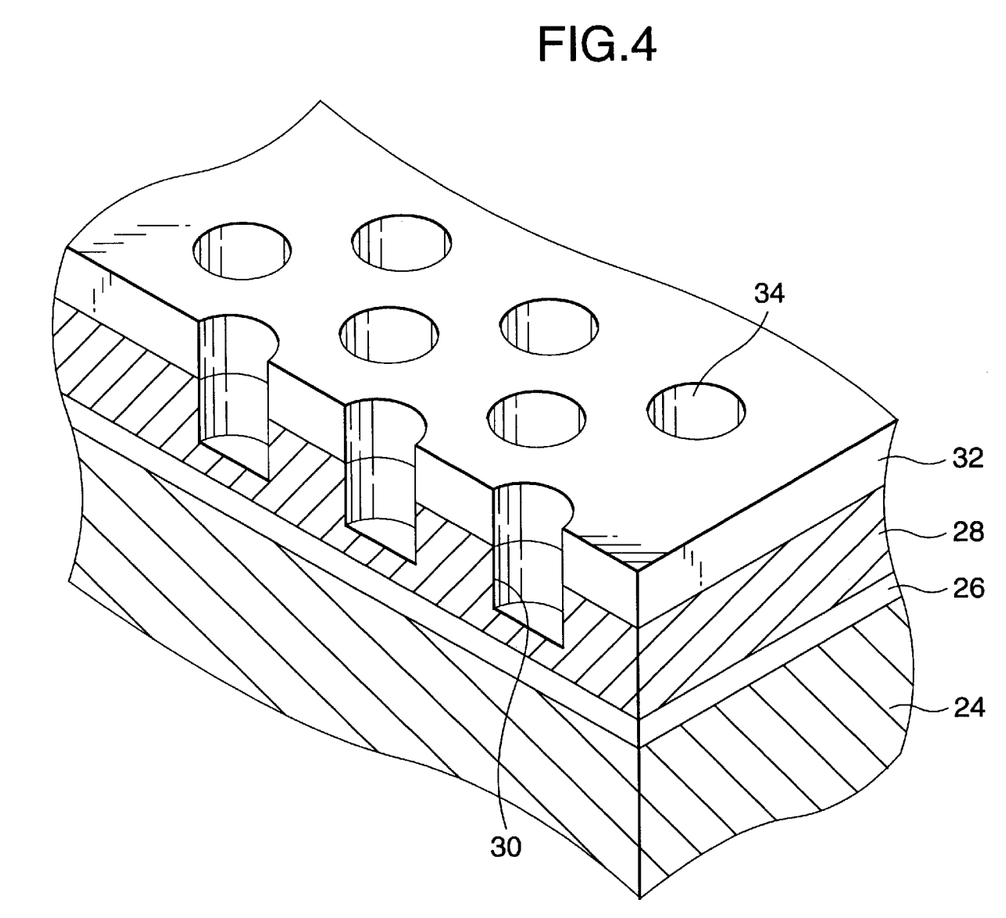
FIG. 4 is a perspective section view for explaining one example of the method of forming a passivation film.

Next, referring to FIG. 4, an example of the method of forming the passivation film 28 shown in FIGS. 1A and 1B will be explained. Process starts from a semiconductor substrate where the insulating film 26 is formed on the element formation layer 24, which contains the circuit elements 22 (shown in FIG. 1A). Aluminum wirings and pads (not shown) are successively formed on the insulating film 26. Next, the passivation film 28 is formed on it.

The passivation film 28 is formed, for example, by depositing a silicon oxide film, silicon nitride film, silicon oxide-nitride film, PSG (phosphorus silicate glass) or other films by CVD (Chemical Vapor Deposition) method.

Then, a patterning is conducted by coating resist 32 on the passivation film 28, and then pre-bake process, exposure, development and post-bake process are conducted on the resist 32. Through-holes 34 are formed in the layer of resist 32 located right above the positions at which the thin portions 30 of the passivation film 28 are to be formed.

By using resist 32, on which the through-holes 34 are formed, as a mask, etching, for example, reactive ion etching, is conducted is used. Etching is conducted so that the thin portions 30 of a predetermined depth can be formed on the passivation film 28. After that, the resist 32 is removed from the passivation film 28 as shown in FIG. 1A.

In the above embodiment, an uneven shaped film, whose upper surface has a plurality of independent thin portions 30 are formed on the surface of the flat passivation film 28 is explained. However, it should be noted that the present invention is not limited to the above specific embodiment. For example, the uneven surface film may be formed in such a manner that a plurality of independent thick portions are formed on the upper surface of the flat passivation film.

Figure 5A:
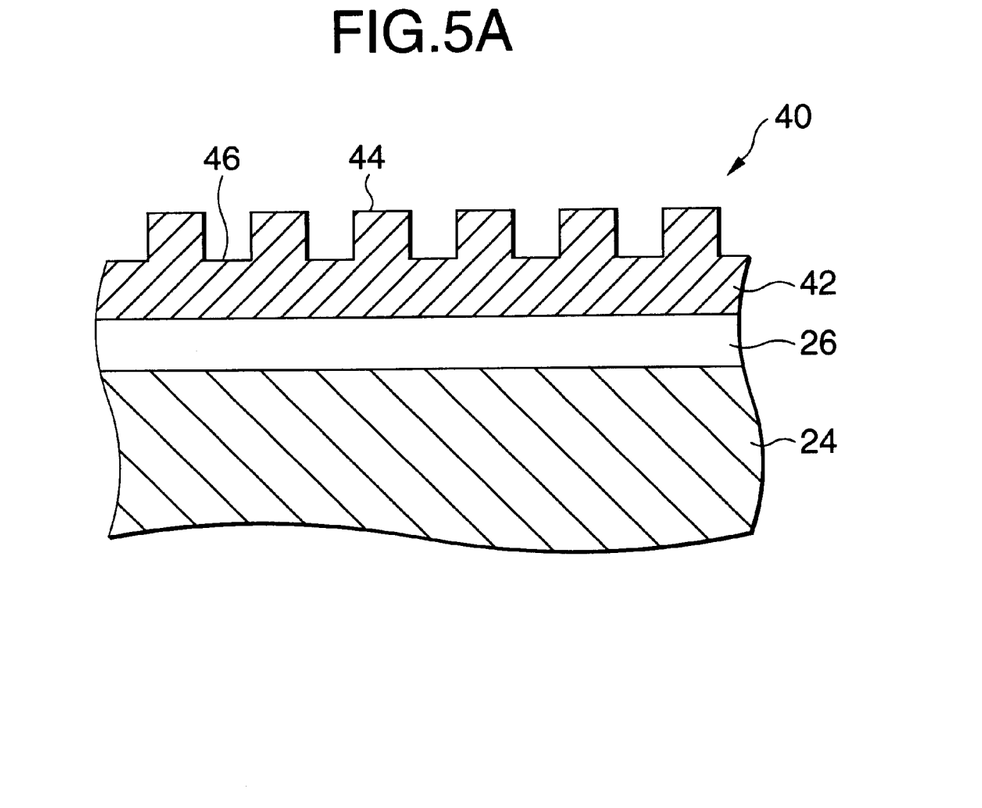
FIG. 5A is a partial section view showing a structure of IC chip according to a second embodiment of the present invention.

FIG. 5A is a partial section view showing a structure of IC chip 40 provided with the above-mentioned uneven surface film, which is a second embodiment of the present invention. In the same manner as that described before, the insulating film 26 is formed on the element formation layer 24, and aluminum wirings and pads (not shown) are formed on the insulating film 26. The passivation film 42 (protective uneven film) is formed on a surface of IC chip 40.

IC chip 40 differs from IC chip 20 described before (shown in FIG. 1A), where, the uneven surface film of IC chip 40 is formed in such a manner that a plurality of independent thick portions 44 are formed on an upper surface of the flat passivation film 42.

Comparing the passivation film 42 of IC chip 40 with the passivation film 28 of IC chip 20, it is possible to obtain the average thickness of the passivation film 42 to be less than that of the passivation film 28,even if the surface areas, film thickness of the thin portions (the thin portion 30 of the passivation film 28, and the thin portion 46 of the passivation film 42) and film thickness of the thick portions (the thick portion 36 of the passivation film 28, and the thick portion 44 of the passivation film 42) are the same. Therefore, the heat radiation efficiency through the passivation film can be further increased.

Similar to the IC chip 20, various shapes of the thick portions 44 and various arrangement patterns can be applied to the IC chip 40. For example, it is possible to apply arrangement patterns when the thin portions 30 are replaced with the thick portions 44 in the arrangement patterns shown in FIG. 1B and FIGS. 2A to 2F.

Figure 5B:
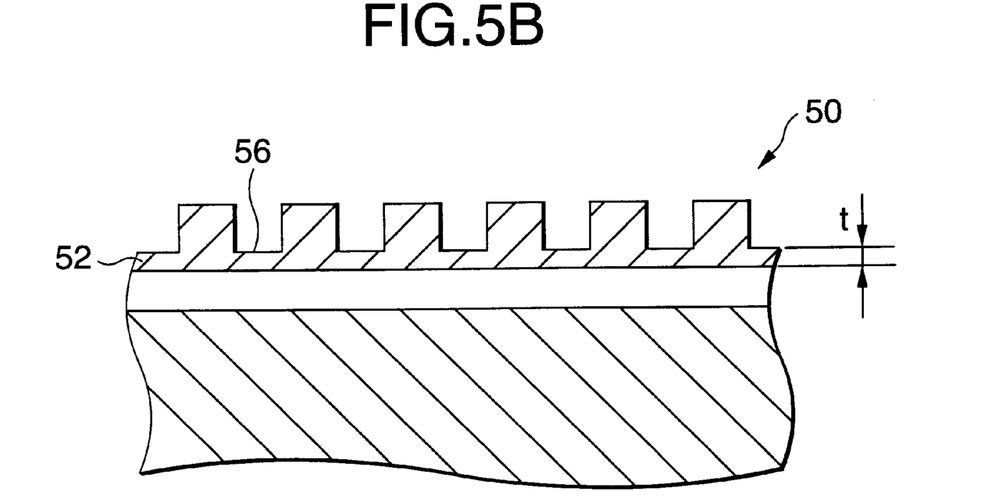
FIG. 5B is a partial section view showing a structure of IC chip according to a third embodiment of the present invention.

FIG. 5B is a partial section view showing a structure of IC chip 50 which is a semiconductor device according to a third embodiment of the present invention. In this IC chip 50, film thickness "t" of the thin portions 56 of the passivation film 52 is the minimum film thickness to protect the circuit elements formed in IC chip 50. The minimum thickness depends on film characteristics. It is 200–500 nm, in the case of the silicon oxide film or the silicon nitride film adopted as the passivation film.

Even if the surface areas are the same, it is possible to produce the passivation film 52, with thinner average thickness. Therefore, the heat radiation efficiency through the passivation film 52 can be further increased.

Figure 6A:
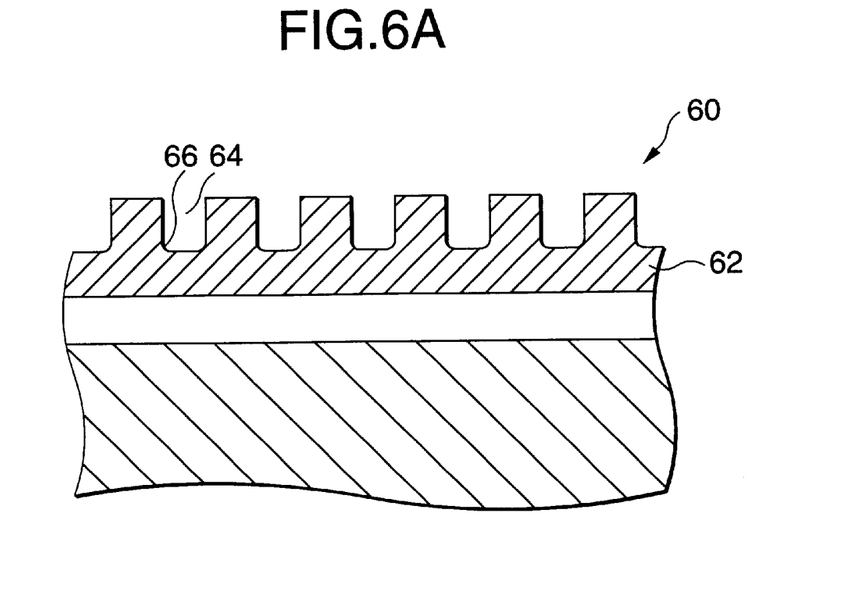
FIG. 6A is a partial section view showing a structure of IC chip according to a fourth embodiment of the present invention.

FIG. 6A is a partial section view showing a structure of IC chip 60 which is a semiconductor device according to a fourth embodiment of the present invention. In this IC chip 60, the thin portions 64 of the passivation film 62 are formed to have smooth arcuate corners 66.

Stress concentration to the corners 66 of the thin portions 64 can be reduced. Therefore, even if the passivation film 62 is deformed, possibility that the thin portions 64 of the passivation film 62 are broken can be reduced. That is, while keeping a function to protect the circuit elements (not shown) such as wirings and transistors formed in IC chip 60 physically, the heat radiation efficiency through the passivation film 62 can be increased.

Figure 7A:
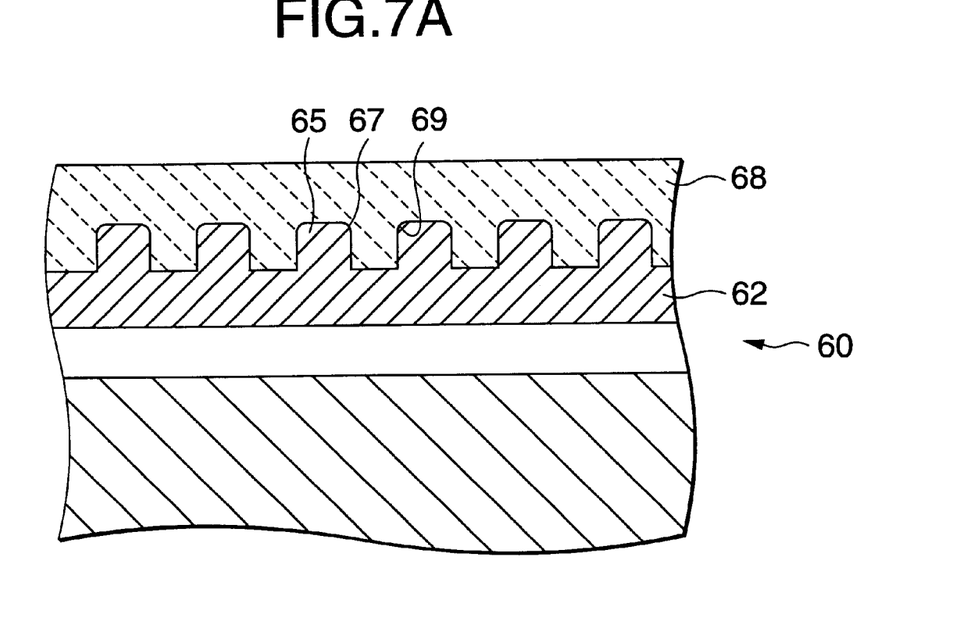
FIG. 7A is a partial section view showing a structure of IC chip according to a fifth embodiment of the present invention.

In the structure shown in FIG. 6A, the corners 66 of the thin portions 64 of the passivation film 62 are formed into a smooth arcuate shape. However, it is possible to form the corners 67 of the thick portions 65 of the passivation film 62 into a smooth arc as shown in FIG. 7A, which is a fifth embodiment of the present invention. Due to the above structure, even if an upper surface of IC chip 60 is covered with a sealing material 68 made of epoxy resin, or a package (not shown), it is possible to reduce stress concentration to the corners 69 of the sealing material 68. Therefore, even when the sealing material 68 is deformed, possibility that the corners 69 of the sealing material 68 are broken can be reduced. As a result, it is possible to reduce a possibility that IC chip 60 itself is damaged.

Figure 7B:
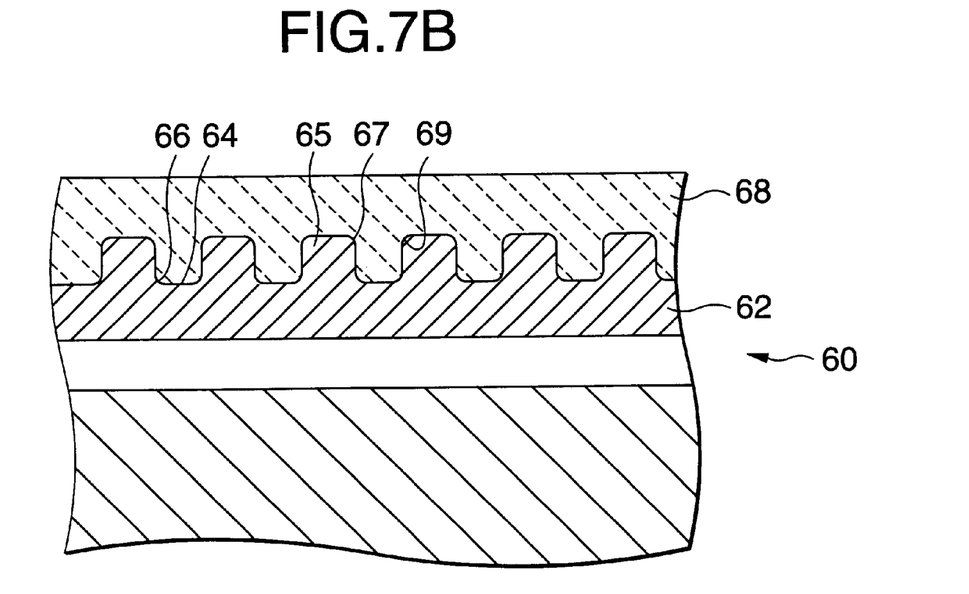
FIG. 7B is a partial section view showing a structure of IC chip according to a sixth embodiment of the present invention.

As shown in FIG. 7B, both the corners 66 of the thin portions 64 of the passivation film 62 and the corners 67 of the thick portions 65 of the passivation film 62 can be formed into a smooth arcuate shape, which is a sixth embodiment of the present invention. By the above structure, it is possible to reduce further a possibility that IC chip 60 is damaged.

The shape of the cross sections of the corners 66 and 67 are not limited to the arcuate shape. As long as stress concentration to the corners 66 and 67 can be reduced, any shape may be adopted.

Figure 6B:
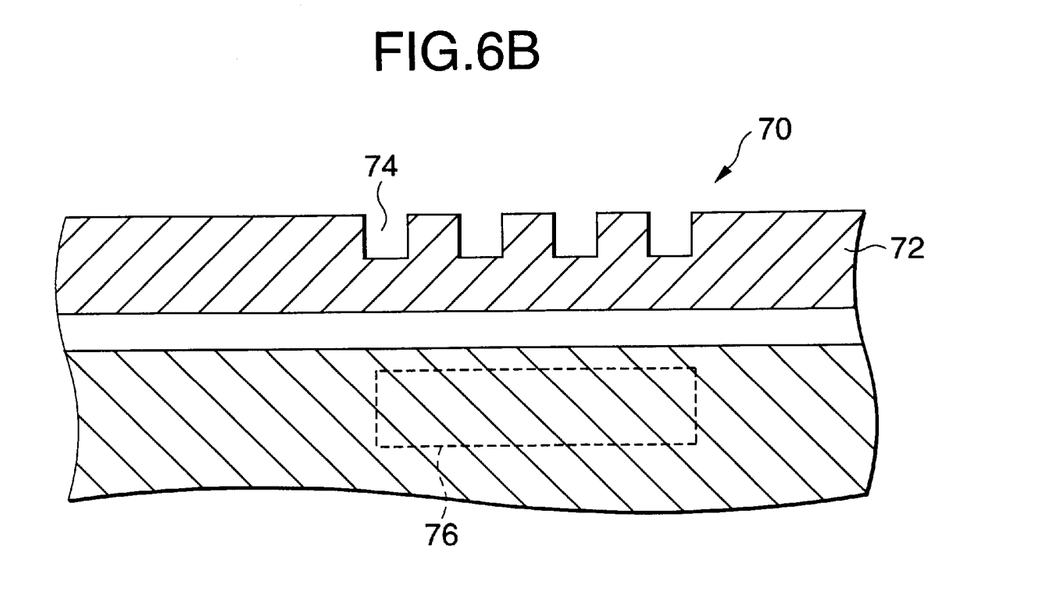
FIG. 6B is a partial section view showing a structure of IC chip according to a seventh embodiment of the present invention.

FIG. 6B is a partial section view showing a structure of IC chip 70 which is a semiconductor device according to a seventh embodiment of the present invention. In the previous embodiments, the entire passivation film is formed into an uneven surface film. In IC chip 70 of this embodiment, the uneven surface film is formed only in portions close to the circuit elements 76, which generates a large amount of heat. That is, the thin portions 74 of the passivation film 72 are formed only in the portions close to the circuit elements 76 concerned.

Due to the above arrangement, it is possible to emit heat generated by the circuit elements 76 more effectively. That is, while an area in which the uneven surface film is formed is minimized, the heat radiation efficiency through the passivation film 72 can be increased, which is effective when it is necessary to reduce the portion in which the uneven surface film is formed.

Figure 8:
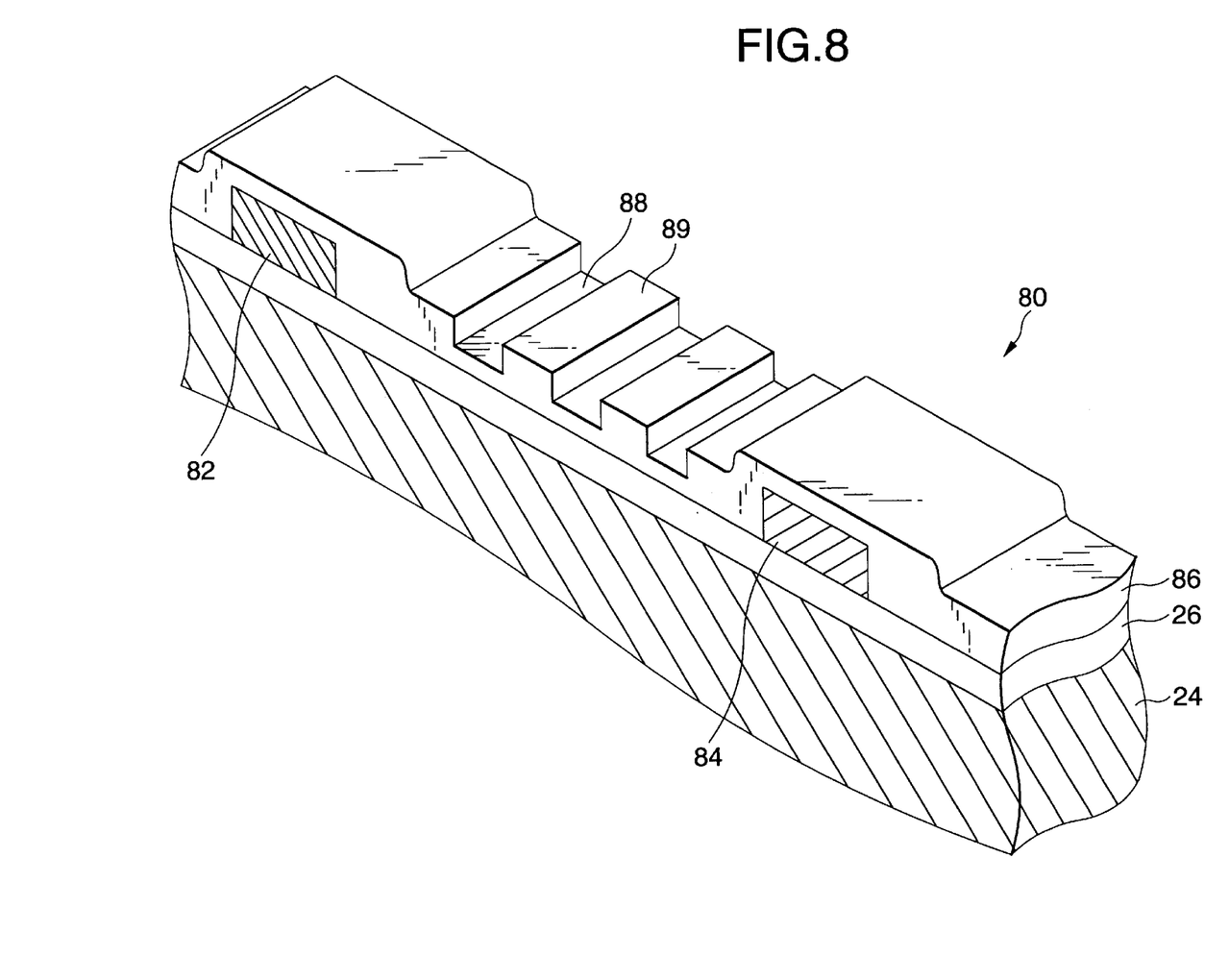
FIG. 8 is a partial section view showing a structure of IC chip according to an eighth embodiment of the present invention.

FIG. 8 is a perspective section view showing a structure of IC chip 80 which is a semiconductor device according to an eighth embodiment of the present invention. The insulating film 26 is formed on the element formation layer 24, and aluminum wirings 82, 84 (conductive sections) are formed on the insulating film 26. The passivation film 86 (protective film) is formed to cover them.

A portion of the passivation film 86 located between the aluminum wirings 82 and 84 is composed of an uneven surface film on which the belt-shaped thin portions 88 and the thick portions 89 are alternately arranged. There is no circuit element such as aluminum wirings, immediately below the passivation film 86 between the aluminum wirings 82 and 84. Accordingly, the film thickness of the passivation film 86 can be reduced in this portion. It is possible to form an uneven surface film having the thin portions 88. That is, it is possible to form an uneven surface film, whose average thickness is reduced, and therefore the heat radiation efficiency is increased.

Since the thickness of the passivation film 86 in the thin portions 88 is reduced, in case that the electric potential differs between the aluminum wirings 82 and 84, the electric resistance of the passivation film 86, which is an electric current leak path between the aluminum wirings 82 and 84, can be increased. Therefore, it is possible to improve electric isolation between the aluminum wirings 82 and 84.

In the case of IC chip having a power element such as a power transistor, a passivation film having a very low electric conductivity such as silicon-rich SIO film, silicon-rich SiN or silicon-rich SiON film is used in order to release an electric charge accumulated on and in the passivation film 86. In this case, there is a tendency that the insulating property between the aluminum wirings 82 and 84 is lowered. In this case, a passivation film 86 shown in FIG. 8 is preferable, because it is possible to improve the electric isolation between the aluminum wirings 82 and 84 by providing.

Figure 9:
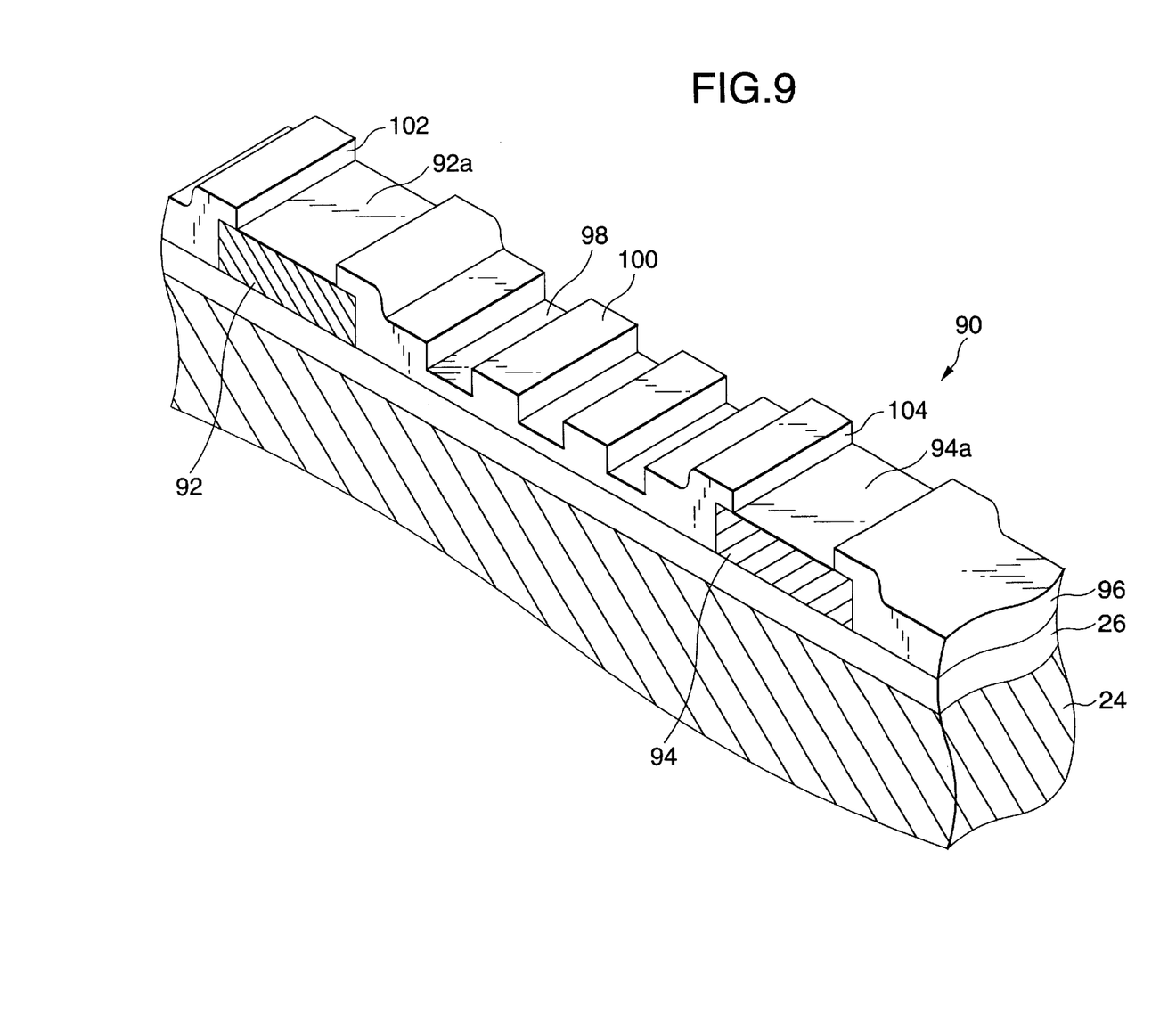
FIG. 9 is a partial section view showing a structure of IC chip according to a ninth embodiment of the present invention.

FIG. 9 is a perspective section view showing a structure of IC chip 90 which is a semiconductor device according to a ninth embodiment of the present invention. The insulating film 26 is formed on the element formation layer 24, and pads 92, 94 (exposed electric conductors) used for the bonding wires or the inspection are formed on the insulating film 26. An upper surface of IC chip 90 is covered with the passivation film 96. Openings 102, 104 are formed in portions of the passivation film 96. Therefore, surfaces 92a, 94a of the pads 92, 94 are exposed to the openings 102, 104. Electric potential differs between the pads 92 and 94.

A portion of the passivation film 96 located between the pads 92 and 94 is composed of an uneven surface film on which the belt-shaped thin portions 98 and the thick portions 100 are alternately arranged. Therefore, the length of an electric path which is formed along the surface of the passivation film 96 is extended. This is the path where leak current flows most easily among the electric paths generated between the surface 92a of the pad 92 and the surface 94a of the pad 94. Due to the above structure, it is possible to increase the electric isolation between the surface 92a of the pad 92 and the surface 94a of the pad 94.

Concerning the third to ninth embodiments described above, the embodiment, which has an uneven surface film with a plurality of independent thin portions formed on the upper surface of the flat passivation film can be applied to the embodiment which has an uneven surface film with a plurality of independent thick portions formed on the upper surface of the flat passivation film.

On the contrary, the embodiment, which has an uneven surface film with a plurality of independent thick portions formed on the upper surface of the flat passivation film, can be applied to the embodiment which has an uneven surface film with a plurality of independent thin portions formed on the upper surface of the flat passivation film.

Thinner passivation film is better from the viewpoint of the heat radiation and miniaturization, however, it is important to keep the thickness of the film to be sufficient for protection. Usually thickness of the passivation film is 1.0–1.5 μm, it is preferable that the thickness of the thin portions is 200–500 nm.

In the above embodiments, the passivation film is composed of one-layer passivation film formed as the uppermost layer of the semiconductor substrate, in which circuit elements are formed. However, it should be noted that the passivation film is not limited to the above specific passivation film. As long as film is formed on the surface of a semiconductor substrate in which the circuit elements are formed and provides protection to the semiconductor substrate, any film may be used. The passivation film is not necessarily limited to one-layer in the present invention, but the present invention can be applied to a passivation film composed of multiple layers, the number of which may be two or more.

In case the thickness is reduced too much, the passivation effect is damaged. Hence, it is necessary to control the amount of etching with high accuracy when the thin portions are formed by the etching.

Figure 10:
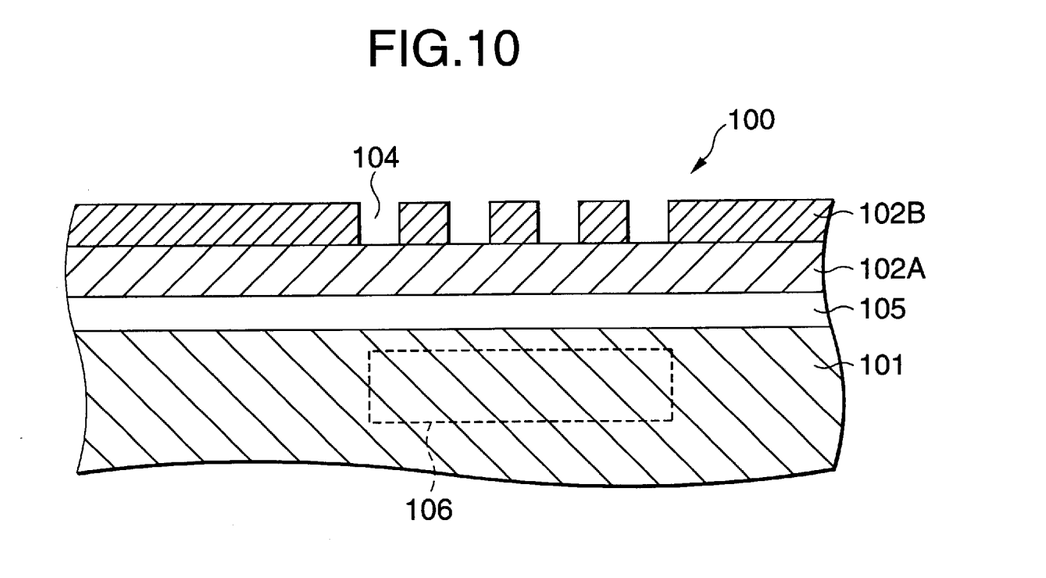
FIG. 10 is a partial section view showing a structure of IC chip according to a tenth embodiment of the present invention.

To control the amount of etching, it is preferable to use a two-layer film as the passivation film wherein upper layer film has etching selectivity with respect to lower layer film. In this case, the thin portion is constituted only by the lower layer film and the thick portion is constituted by the two-layer film. Thus, it is possible to form a passivation film having high heat radiation efficiency and high reliability. For instance, a semiconductor chip 100 according to the tenth embodiment of the present invention shown in FIG. 10, where silicon nitride film is used as the lower layer film 102A and silicon oxide film is used as the upper layer film 102B, the silicon nitride film works as an etching stopper when the silicon oxide film is etched, resulting a passivation film 102 consists of thick portions 108 and thin portions 104 whose thickness is controlled with high accuracy. Here, 106 is a power device formed in a semiconductor substrate 101. The passivation film 102 is formed on insulating film 105 which covers the upper surface of the substrate. Aluminum wiring (not shown) are provided between the insulating film 105 and the passivation film 102.

It is further preferable to use three-layer film wherein first silicon oxide film, silicon nitride film and second silicon oxide film are laminated subsequently. In the three-layer film, thin portions is two-layer film constituted by the first silicon oxide film and the silicon nitride film, thick portions is the three-layer film constituted by the first silicon oxide film, the silicon nitride film and the second silicon oxide film. According to the construction, since the thin portions are two-layer structure, sufficient passivation effect is achieved, when excessive reduction of the film thickness due to the over etching can be avoided by the etching selectivity of the silicon oxide film and the silicon nitride film. Thereby the film thickness control with high accuracy can be achieved.

As the passivation film, other materials can be used, for example an inorganic film, an organic film, or laminated film of an inorganic film and an organic film, can be used. As an inorganic film, the silicon oxide film, silicon nitride film, laminated film of the silicon oxide and the silicon nitride, PSG film, BPSG film, glass or the like can be used. As an organic film, polyimide, silicon varnish, silicon gam or the like can be used. And as the method of forming the passivation film, in addition to the sputtering method and CVD method, suitable methods, for example, a plasma CVD method or spin coat method or the like may be adopted.

The passivation film having the thin and thick portions and upper surface of which is planar may be formed on the circuit element formation area.

In addition, the construction of the present invention can be applied to a resin-sealing type semiconductor device wherein the upper layer of the passivation film is sealed by sealing resin or the like and also a bare chip mounted on a board directly.

What is claimed is:

1. A semiconductor device comprising:
   a semiconductor substrate having a circuit element;
   a base layer formed on the semiconductor substrate, the base layer including an insulating layer; and
   a passivation film formed on the base layer such that a lower surface thereof is planar, and such that at least part of an upper surface thereof is formed into an uneven shape in which a film thickness of thin portions is one fifth to one third of a film thickness of thick portions.

2. The semiconductor device as set forth in claim 1, wherein the uneven shape is formed at least above an area in which the circuit element is formed.

3. The semiconductor device as set forth in claim 2, wherein at least one of the thin portions and the thick portions are arranged so as to be a closest packing structure.

4. The semiconductor device as set forth in claim 3, wherein the thin or thick portions are regularly arranged such that the each center of adjacent thin or thick portions form a regular triangle.

5. The semiconductor device as set forth in claim 2, wherein the thin portion is formed so as to be the minimum thickness capable of protecting the circuit element.

6. The semiconductor device as set forth in claim 2, wherein at least one of corner portions of the each thin portion and each thick portion defined by the each thin portion is rounded.

7. The semiconductor device as set forth in claim 2, wherein the passivation film includes a first insulating layer and a second insulating layer laminated on the first insulating layer and having etching selectivity with respect to the first insulating layer, and
   portions where the second insulating layer is selectively removed and thereby only the first insulating layer remains constitute the thin portions.

8. The semiconductor device as set forth in claim 2, wherein the passivation film includes first silicon oxide film, silicon nitride film laminated on the first silicon oxide film and second silicon oxide film laminated on the silicon nitride film,
   the thin portions are constituted by the first silicon oxide film and the silicon nitride film, and
   the thick portions are constituted by the first silicon oxide film, the silicon nitride film and the second silicon oxide film.

9. The semiconductor device as set forth in claim 1, wherein the passivation film is formed on the planarized insulating layer as the base layer.

10. The semiconductor device as set forth in claim 9, wherein the base layer is planarized by the CMP method.

11. The semiconductor device as set forth in claim 9, wherein the base layer includes the insulating layer planarized by the CMP method and a wiring section formed on a part of the insulating layer.

12. The semiconductor device as set forth in claim 1, wherein the uneven shaped film is formed into a shape such that a plurality of independent thick portions are provided on the passivation film which is substantially planar.

13. The semiconductor device as set forth in claim 1, wherein the uneven shaped film is formed in a vicinity area of a circuit element generates a large amount of heat, the vicinity area includes at least a part of above the circuit element.

14. The semiconductor device as set forth in claim 1, wherein
   the base layer on which the passivation film is to be formed, includes insulating film covers the circuit element, and conductive sections formed on a part of the insulating film, and
   the uneven shaped film is arranged between the conductive sections.

15. The semiconductor device as set forth in claim 14, wherein an electric potential difference exists between the conductive sections.

16. The semiconductor device as set forth in claim 15, wherein the conductive sections includes conductive sections exposed from the passivation film, and the uneven shaped film is arranged between the exposed conductive sections having the electric potential difference therebetween.

17. The semiconductor device as set forth in claim 16, wherein the passivation film includes at least one of silicon-rich SiN film, silicon-rich SiO film and silicon-rich SiON film.

18. The semiconductor device as set forth in claim 1, wherein
   a base layer on which the passivation film is to be formed including insulating film, and at least two wiring sections formed on a part of the insulating film, and
   the uneven shaped film has at least one groove portion of the thin portion extending in parallel with at least one of the wiring sections.

19. The semiconductor device as set forth in claim 1 further comprising:
   at least two electrode pads exposed from the passivation film, and
   wherein the passivation film has an uneven surface between the electrode pads.

20. The semiconductor device as set forth in claim 1, wherein the passivation film is formed directly on the insulating layer, the uneven shape of the upper surface of the passivation film not corresponding to a shape of an upper surface of the insulating layer.

21. A semiconductor device comprising:
   a semiconductor substrate having a circuit element;
   a base layer formed on the semiconductor substrate, the base layer including an insulating layer; and
   a passivation film formed into an uneven shape on the base layer and including a plurality of insulating layers, each insulating layer being materially different from any abutting insulating layer, wherein thin portions of the passivation film are formed by removing the uppermost insulating layer of the passivation film and thick portions of the passivation film are constituted by all the insulating layers of the passivation film.

22. A semiconductor device comprising:
a semiconductor substrate having a circuit element that generates heat; and
a passivation film formed into an uneven shape over an upper surface of the semiconductor substrate and including a plurality of insulating layers, each insulating layer being materially different from any abutting insulating layer, wherein thin portions of the passivation film are formed by removing the uppermost insulating layer of the passivation film and thick portions of the passivation film are constituted by all the insulating layers of the passivation film.

* * * * *